United States Patent
Malik et al.

(10) Patent No.: US 9,300,317 B2
(45) Date of Patent: Mar. 29, 2016

(54) ADAPTIVE DELAY BASED ASYNCHRONOUS SUCCESSIVE APPROXIMATION ANALOG-TO-DIGITAL CONVERTER

(71) Applicant: STMicroelectronics International N.V., Amsterdam (NL)

(72) Inventors: Rakesh Malik, Noida (IN); Chandrajit Debnath, Greater Noida (IN); Ashish Sharma Kumar, Ghaziabad (IN); Pratap Narayan Singh, Chahania Chandauli (IN)

(73) Assignee: STMICROELECTRONICS INTERNATIONAL N.V., Amsterdam (NL)

( * ) Notice: Subject to any disclaimer, the term of this patent is extended or adjusted under 35 U.S.C. 154(b) by 0 days.

(21) Appl. No.: 14/930,708

(22) Filed: Nov. 3, 2015

(65) Prior Publication Data

US 2016/0056830 A1  Feb. 25, 2016

Related U.S. Application Data

(63) Continuation of application No. 14/230,370, filed on Mar. 31, 2014.

(51) Int. Cl.
| | |
|---|---|
| *H03M 1/34* | (2006.01) |
| *H03M 1/12* | (2006.01) |
| *H03M 1/06* | (2006.01) |
| *H03M 1/46* | (2006.01) |
| *H03M 1/00* | (2006.01) |

(52) U.S. Cl.
CPC .............. *H03M 1/125* (2013.01); *H03M 1/069* (2013.01); *H03M 1/0612* (2013.01); *H03M 1/462* (2013.01); *H03M 1/00* (2013.01); *H03M 1/0695* (2013.01); *H03M 1/12* (2013.01)

(58) Field of Classification Search
CPC ........ H03M 1/00; H03M 1/12; H03M 1/0695
USPC .................. 341/122, 110, 158, 155, 156, 161
See application file for complete search history.

(56) References Cited

U.S. PATENT DOCUMENTS

| | | | |
|---|---|---|---|
| 6,104,329 A | 8/2000 | Kawano | |
| 8,134,487 B2 | 3/2012 | Harpe | |
| 2013/0201043 A1* | 8/2013 | Wong | .................... H03M 1/125 341/122 |
| 2014/0070850 A1 | 3/2014 | Darwhekar et al. | |

* cited by examiner

*Primary Examiner* — Joseph Lauture
(74) *Attorney, Agent, or Firm* — Gardere Wynne Sewell LLP

(57) ABSTRACT

An asynchronous SAR ADC converts an analog signal into a series of digital pulses in an efficient, low power manner. In synchronous SAR ADC circuits, a separate and cumbersome clock signal is used to trigger the internal circuitry of the SAR ADC. Instead of triggering the components of the SAR DAC synchronously with a clock signal, the asynchronous solution uses its own internal signals to trigger its components in an asynchronous cyclic manner. Further, in order to increase efficiency and guard against circuit failures due to difficulties arising from transient signals, the asynchronous SAR ADC may also include a delay circuit for introducing a variable delay to the SAR ADC cycle.

22 Claims, 3 Drawing Sheets

ADAPTIVE DELAY BASED ASYNCHRONOUS SUCCESSIVE APPROXIMATION ANALOG-TO-DIGITAL CONVERTER

CROSS-REFERENCE TO RELATED APPLICATIONS

This application is a continuation of U.S. application Ser. No. 14/230,370, filed Mar. 31, 2014, and entitled "ADAPTIVE DISPLAY BASED ASYNCHRONOUS SUCCESSIVE APPROXIMATION ANALOG-TO-DIGITAL CONVERTER", the entire contents of which are hereby incorporated by reference.

BACKGROUND

An analog-to-digital converter (ADC) is used in electronic devices for converting an analog signal (such as a voltage or a current) to a digital number that represents the analog signal's amplitude. Such a conversion involves quantization of an input signal via samples at periodic intervals. The result is a sequence of digital values that have converted a continuous-time and continuous-amplitude analog signal to a discrete-time and discrete-amplitude digital signal.

A successive-approximation ADC (SAR ADC) uses a comparator to successively narrow a range that contains the input signal (voltage in the remaining examples herein). At each successive step, the converter compares the input voltage to the output of an internal digital-to-analog converter (DAC) which might represent the midpoint of a selected voltage range. At each step in this process, the approximation is stored in a successive approximation register (SAR). In general, a SAR ADC converts a sample of an analog signal into a digital value in a specific number of clock cycles that is equal to the number of bits in the digital value along with a few cycles required to perform sampling. In this respect, SAR ADCs are medium speed. A faster speed for conversion is desired in faster speed circuits.

SUMMARY

In an embodiment, an analog to digital converter comprises: a differencing circuit configured to receive as input a sampled differential input voltage and a fraction of a reference voltage and to generate a differential output voltage representing a difference between the sampled differential input voltage and the fraction of the reference voltage; a delay circuit configured to generate a delay signal having a delay value that is a function of said differential output voltage; a comparison circuit configured to receive as input the differential output voltage and to generate an output signal as a function of a sign of the differential output voltage when triggered by a trigger signal derived from the delay signal; and control logic configured to receive the output signal and generate said fraction of the reference voltage as a function of the output signal.

In an embodiment, a method, comprises: generating a differential output voltage representing a difference between a sampled differential input voltage and a fraction of a reference voltage; generating a delay signal having a delay value that is a function of said differential output voltage; in response to the delay signal, generating an output signal as a function of a sign of the differential output voltage; and generating the fraction of the reference voltage as a function of the output signal.

In an embodiment, an analog to digital converter comprises: a register configured to hold a digital value; a digital to analog converter configured to convert the digital value to a fractional analog reference; a differencing circuit configured to determine a difference between an analog input signal and the fractional analog reference; a comparator triggered by a trigger signal to determine a sign of said difference; a delay circuit configured to generate the trigger signal with a delay value determined by said difference; and a control circuit configured to replace a bit of said register in response to the sign output by the comparator in response to the trigger signal.

BRIEF DESCRIPTION OF THE DRAWINGS

Aspects and many of the attendant advantages of the claims will become more readily appreciated as the same become better understood by reference to the following detailed description, when taken in conjunction with the accompanying drawings, wherein:

DETAILED DESCRIPTION

The following discussion is presented to enable a person skilled in the art to make and use the subject matter disclosed herein. The general principles described herein may be applied to embodiments and applications other than those detailed above without departing from the spirit and scope of the present detailed description. The present disclosure is not intended to be limited to the embodiments shown, but is to be accorded the widest scope consistent with the principles and features disclosed or suggested herein.

By way of overview, the subject matter disclosed herein may be directed to a system and method for using an asynchronous SAR ADC to convert an analog signal into a series of digital pulses in a speed efficient, low power manner. In synchronous SAR ADC circuits, a separate and cumbersome clock signal is used to trigger the internal circuitry of the SAR ADC. Requiring a separate clock signal other than sampling clock leads to unneeded circuitry and wasted time because of the rigid, steady manner of triggering components with a single, unwavering clock signal. Instead of triggering the components of the SAR DAC synchronously with a clock signal, the asynchronous solution uses its own internal signals to trigger its components in an asynchronous cyclic manner.

Further, in order to increase efficiency and guard against circuit failures due to difficulties arising from transient signals, the asynchronous SAR ADC may also include a delay circuit for introducing a variable delay to the SAR ADC cycle. In an embodiment, the delay may be inversely proportional to the magnitude of an input signal. In this manner, a large input signal may need only a small delay as large signals can be easily distinguished from transient signals. However, with smaller input signals, additional time (longer delay) may be needed for the circuitry to distinguish the actual input signal from transients. These and other aspects of various embodiments are described below with respect to FIGS. 1-4.

Figure 1:
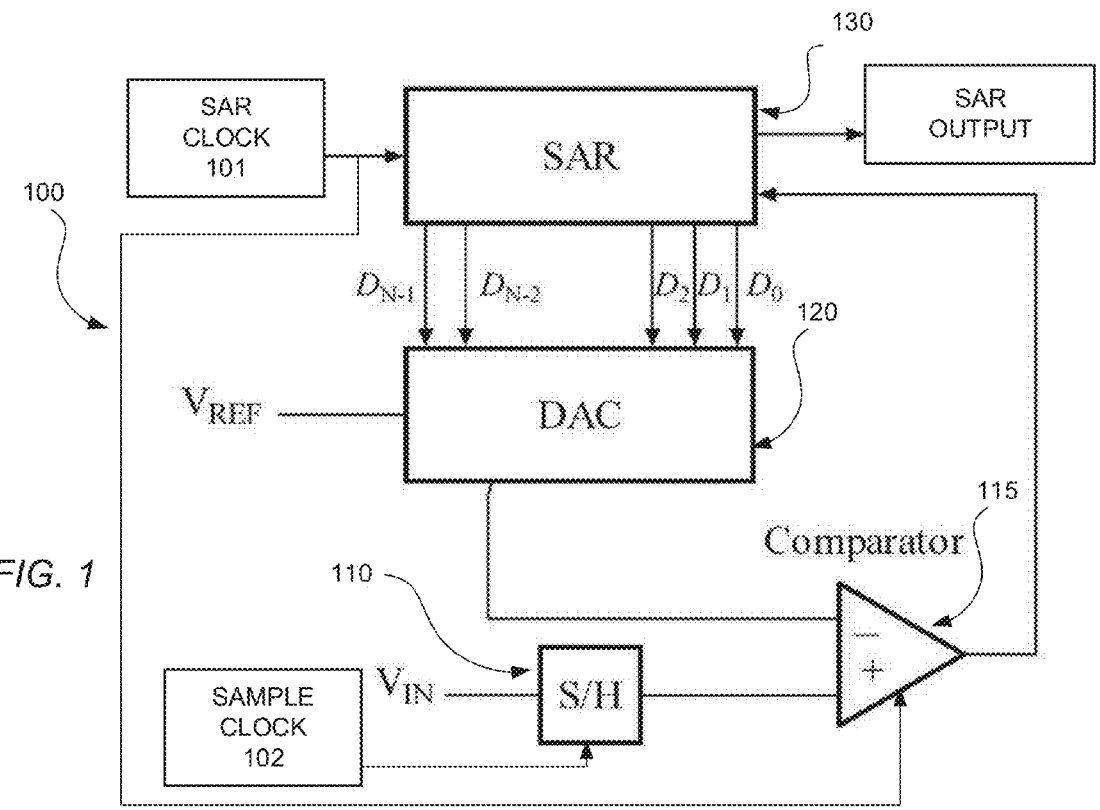
FIG. 1 is a circuit diagram of a synchronous SAR ADC.

Prior to discussing the aspects of an asynchronous SAR ADC, a synchronous SAR ADC 100 is discussed with respect to FIG. 1. As mentioned previously, a synchronous SAR ADC 100 converts a sample of an analog signal into a digital value in a number of clock cycles equal to the number of bits in the digital value and some cycles required to perform the sampling. By way of example with respect to FIG. 1, assume that the SAR ADC 100 converts a sample of an analog voltage signal received at the input node Vin into an 8-bit digital value.

Referring to FIG. 1, a sample/hold circuit 110 samples the analog signal Vin at the rate of a sampling clock 102 connected thereto. At the initial sampling, the Successive Approximation Register (SAR) 130 is loaded (via control from a control logic block not shown in FIG. 1) with an initial value of 10000000, which represents a digital value approximately equal to Vref/2, where Vref is the full-range reference voltage for the internal Digital-to-Analog Converter (DAC) 120. So, the DAC 120 itself initially outputs the analog value Vref/2 in response to the 10000000 in the SAR 130. This output of the DAC 120 is coupled to one input of a comparator 115 while the other input of the comparator 115 is coupled to the sampled and held value of Vin. The comparator 115 is then triggered via the control logic block (not shown) with each cycle of the SAR clock 101.

With these two inputs, the comparator 115 is configured to output a logic 0 if the sample of Vin is less than the DAC 120 output and configured to output a logic 1 if the sample of Vin is greater than the DAC 120 output. At first pass with the DAC output set to Vref/2, the comparator 115 outputs a logic 0 if the sample of Vin is less than Vref/2 and outputs a logic 1 if the sample of Vin is greater than Vref/2. Then, the value output by the comparator 115 is loaded into the MSB position $D_{N-1}$ of the SAR 130. So, in this first SAR clock 101 cycle, if the comparator outputs a logic 1, then the SAR 130 continues to hold 10000000 (which still represents Vref/2); but if the comparator outputs a logic 0, then the content of the SAR is changed to 00000000 (which represent zero voltage).

Next, at the beginning of the next cycle of the SAR clock 101, the MSB−1 i.e. $D_{N-2}$ bit is set to logic 1. So, if the SAR 130 held 10000000 after the first clock cycle, it now holds 11000000 (which represents 3Vref/4); alternatively, if the SAR 130 held 00000000 after the first clock cycle, it now holds 01000000 (which represent Vref/4). So, the DAC 120 outputs the analog value Vref/4 if the SAR 130 holds 01000000, or 3Vref/4 if the SAR 130 holds 11000000 to the input of the comparator 615.

In the second SAR clock 101 cycle, the comparator 115 outputs a logic 0 if the sample of Vin is less than the DAC 120 output (Vref/4 or 3Vref/4). Alternatively, the comparator 115 outputs a logic 1 if the sample of Vin is greater than the DAC 120 output. Then, the value output by the comparator 115 during this second SAR clock 101 cycle is loaded into the MSB−1 $D_{N-2}$ position of the SAR 130. So, if the comparator 115 outputs a logic 1, then the SAR 130 holds 11000000 or 01000000 (depending on the previously determined value of the MSB); but if the comparator 115 outputs a logic 0, then the SAR 130 holds either 10000000 or 00000000, (again, depending on the previously determined value of the MSB).

The SAR ADC 100 continues to operate in this manner until values of all N−1 bits are decided by the comparator 115, with the value of the LSB $D_0$ being decided last. After eight SAR clock 101 cycles, the value held in the SAR 130 is output as the digital value that represents the sample of Vin. This final digital value is then moved to an output register (SAR Output) to provide digital code equivalent to supplied analog input Vin. Then, the SAR 130 is reset to 10000000, Vin is sampled again in response to sample clock 102, and the above cycle repeats. In this manner, a synchronous SAR ADC 100, the period of the SAR 130 is N times the SAR clock 101, where N is the number of bits in the digital signal plus additional sample clock 102 cycles involved for sampling in the digital value output by the SAR 130. For example, for an 8-bit SAR ADC 100 with 2 clock cycles for sampling, the SAR 130 period is 8 SAR clock 101 cycles+2 cycles. Thus, an SAR clock 101 is needed to trigger the SAR ADC 100 10 times for every one sample clock 102 cycles.

To generate such an SAR clock 101, typically the SAR ADC 100 will require a high speed clock which may come from a phase-locked loop/digital-locked loop (PLL/DLL—not shown) that generates the SAR clock 101 from the sample clock 102 source, i.e., crystal oscillator (not shown). The sample clock 102 is typically derived from the SAR clock 101 that is in turn derived from a local high speed clock (not shown). But unfortunately, a PLL/DLL consumes a significant amount of power, and, therefore, a synchronous SAR ADC 100 may be unsuitable for low-power applications. Examples of such applications include battery-operated sensors (or microcontrollers that include sensors) that need to be active only periodically, such as an outside temperature sensor that is monitored only a few times per day to yield an air or water temperature. Furthermore, a PLL/DLL takes up a significant amount of area on a chip or board.

For low-power applications (and/or for applications where chip or board area is at a premium), an asynchronous SAR ADC may be utilized instead. In general, an asynchronous SAR ADC does not require an SAR clock 101. Instead, the asynchronous SAR ADC uses the output transitions of the comparator 615 to clock/trigger the next comparison cycle until all of the bits are determined (a state machine or counter may be used to determine when all of the bits are determined). Such an asynchronous SAR ADC is described with respect to FIGS. 2-4.

Figure 2:
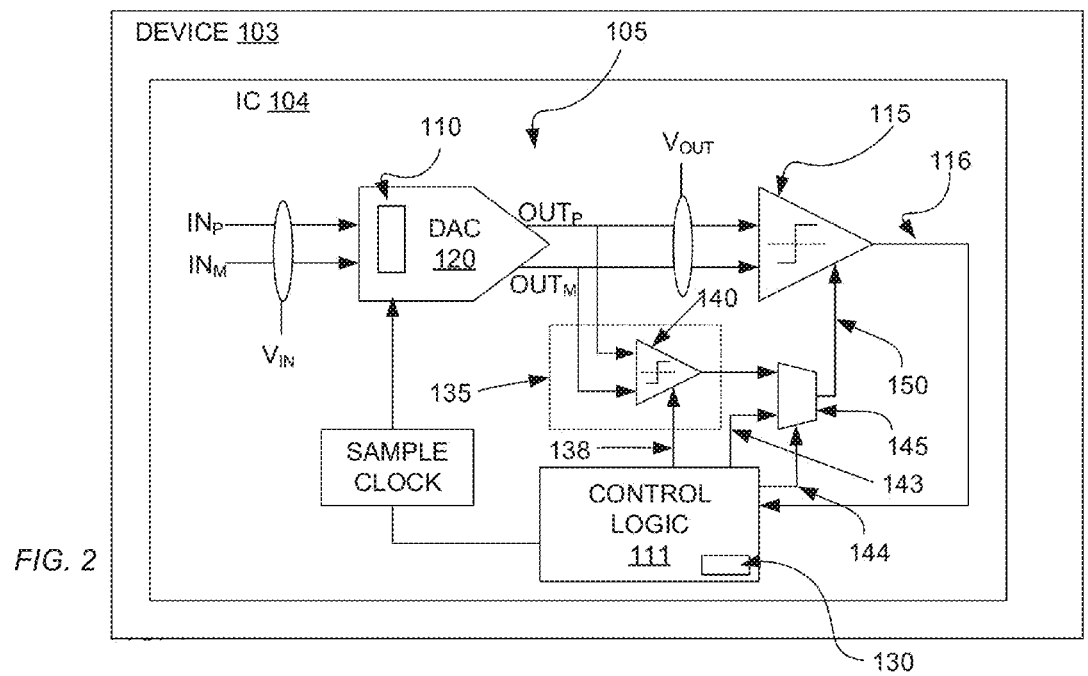
FIG. 2 is a circuit diagram of a device having an integrated circuit with an asynchronous SAR ADC according to an embodiment.

FIG. 2 is a circuit diagram of a device 103 having an integrated circuit 104 with an asynchronous SAR ADC 105 according to an embodiment. In detail, a similar example to the one above with respect to FIG. 1 is used to describe the operation of the asynchronous SAR DAC 105. Thus, the SAR ADC 105 ultimately converts a sample of an input analog signal into an 8-bit digital signal. However, the asynchronous SAR ADC 105 does so without use of a cumbersome SAR clock 101 (FIG. 1) from a PLL circuit.

An asynchronous SAR DAC 105 may use any non-clock signal (typically generated from a control logic block 111) to trigger the comparator 115 in order to adjust the contents of the SAR after each comparison. Thus, in theory, the comparator 115 could possibly operate continuously without need of triggering if the contents of the SAR were to instantaneously update. However, as signals propagate through the comparator and back to the SAR for adjustment which then affects the DAC 120 output, at least some level of delay is needed to ensure that the contents of the SAR and DAC output are updated sequentially.

Thus, the asynchronous SAR ADC should guard against these kinds of internal failures. For example, the timing delay between successive comparator 115 decisions should be long enough to allow the comparator 115 output to settle to ensure one LSB accuracy in the determined digital value. But the total delay for all decisions is to be no longer than a sample period, i.e., the time between successive edges of the sample clock. One way to address this issue is to make the delays from one cycle to the next cycle constant. This may involve simple circuitry to generate these delays, but may lead to inefficiencies because the constant delay must be designed for the worst-case scenario of maximum delay (e.g., worst-case process variation, temperature, voltage). Therefore, the speed of an asynchronous SAR ADC 105 may be limited by the need to make each delay between comparator decisions a maximum worst-case delay.

Furthermore, if the DAC 120 output is zero, or very close to zero, then the comparator 115 may become "stuck", and unable to switch its output to either logic 1 or logic 0 because the comparator 115 has a finite gain. If the comparator 115 becomes stuck, then the SAR ADC 105 will stall, and may not complete its A/D conversion before the next edge of the sample clock. There are known ways to address this metastability-related problem, such as to make the comparator 115 noisy so as to avoid having comparisons so close to zero voltage or using maximum delay limit circuits, but these solutions may adversely affect the accuracy and resolution of the SAR ADC 105.

In the embodiment of FIG. 2, a delay circuit 135 may be used to generate a variable delay signal 150 for triggering the comparator 115 such that the above-described issues are eliminated. The delay generated by the delay circuit 135 is based on monitoring DAC 120 outputs $V_{OUT}$ and generating and inversely proportional delay. In this embodiment, a sample/hold (S/H) circuit 110 (shown as located inside the DAC 120 in this embodiment) samples a differential analog input signal Vin. As shown, the differential analog input signal Vin comprises a first single-ended input signal $IN_P$ and a second single-ended input signal $IN_M$ such that the input voltage signal (to be converted into a digital signal) is $V_{IN}=IN_P-IN_M$. Further, the SAR 130 is shown in this embodiment as being located inside of the control logic block 111 and not shown separately as was the case with respect to FIG. 1.

In operation of the asynchronous SAR ADC 105, the control logic block 111 loads the SAR 130 with an initial value of 10000000, which represents a voltage value of approximately Vref/2, where Vref is again the full-range reference voltage for the DAC 120. Note that in FIG. 2, the DAC 120 is constructed such that its output is also a differential signal comprising a first output signal $OUT_P$–OUTM equal to the difference between the sample of Vin and the magnitude represented by the contents of the SAR 130. Thus, the DAC 120 initially outputs a differential analog signal $V_{OUT}$ that is equal to the difference between the input voltage Vin and Vref/2 in response to the 10000000 in the SAR 130. That is, the relative magnitude of this analog value $V_{OUT}$ equals the difference between the input voltage Vin and Vref/2 such that if Vin is greater than Vref/2, then the magnitude of Vout is positive and if Vin is less than Vref/2, then the magnitude of Vout is negative.

The signals $OUT_P$ and $OUT_M$ are inputs to the comparator 115. The comparator 115, when triggered, will generate a logic 0 signal on its output 116 if Vout is negative (i.e., if $OUT_P<OUT_M$), and generates a logic 1 signal on its output 116 if Vout is positive (i.e., if $OUT_P>OUT_M$). The comparator output 116 is coupled to the control logic block 111 such that the logic signal generated is loaded into the MSB position of the SAR 130. So, if the comparator 115 outputs a logic 1, then the SAR 130 continues to hold 10000000; but if the comparator 115 outputs a logic 0, then the content of the SAR 130 is changed to 00000000.

Of course, the comparator 115 only generates its output 116 signal when triggered. In the synchronous SAR ADC 100 of FIG. 1, this comparator triggering was accomplished through the SAR clock 101. In the asynchronous SAR ADC 105 of FIG. 2, the comparator 115 is triggered from an internally generated delay signal 150 that may be wholly unrelated to any sampling clock signal. Such a delay signal 150 is generated by a delay circuit 135 in conjunction with the control logic block 111. As described in further detail below, the delay signal 150 is generated at intervals inversely proportional to the magnitude of Vout. For example, when Vout is a large voltage, the comparator 115 will have compared a value that is a significantly greater value than a zero difference. Thus, the need to be accurate up to 1 LSB of accuracy and additional delay is relieved such that the DAC 120 will settle. The delay circuit 135 can trigger the comparator 115 with a smaller delay as this voltage difference is relatively larger.

In one embodiment, the delay circuit includes a continuous-time comparator 140 (separate from the bit-determining comparator 115) that comprises two inputs that are coupled respectively to $OUT_P$ and $OUT_M$. The continuous-time comparator 140 features a finite open-loop gain according to a specific gain function that generates an output voltage having a rise or fall time that is proportional to the magnitude of Vout (e.g., the voltage difference between $OUT_P$ and $OUT_M$. Therefore, the output of the comparator 140 generates a logic 1 signal in a time that is inversely proportional the DAC 120 output magnitude. In one embodiment, the output of the delay-circuit comparator 140 may be coupled to the SAR ADC comparator 115 such that when the delay-circuit comparator 140 reaches its logic 1 signal, the SAR ADC comparator 115 will be triggered. Then, once the SAR 130 is updated as needed, the control logic block 111 may reset the delay circuit 135 (if such a reset is needed) with a reset signal 138 and the above cycle repeats.

Thus, as described above, the asynchronous SAR ADC 105 makes the delay between successive comparator 115 cycles inversely proportional to the magnitude of the analog voltage output Vout by the DAC 120. If the DAC output voltage Vout is large, then the input to the comparator 115 is much more than zero and there is no need of any DAC 120 settling, because the large DAC voltage can easily drive the comparator 115 output to the correct value. That is, transients in the DAC output voltage Vout probably will not make the DAC voltage Vout vacillate between positive and negative values. Therefore, the delay can be relatively short. Conversely, if the DAC output voltage Vout is relatively small, then the settling time of the DAC output voltage Vout needs to be longer, because the small DAC voltage Vout needs more time to stabilize before it can drive the comparator 115 output to a correct output value. Therefore, the delay needs to be relatively long. Moreover, the asynchronous SAR ADC 105 triggers the next comparator cycle using a delay signal 150 generated from a signal other than the output signal from the comparator 115; therefore, even if the comparator 115 becomes stuck, the asynchronous SAR ADC 105 will not stall.

In one embodiment, the comparator 140 of the delay circuit 135 may have a gain function that is a linear function of the input (the DAC 120 output). In another embodiment, the gain function may be an exponential function its input. Any other suitable gain function may be realized in order to provide enough delay to the triggering of the comparator 115.

As discussed above, in one embodiment, the delay signal 150 may be used to trigger the comparator 115 directly or to effectively latch the output of the comparator 115. For example, the delay signal 150 may be provided directly to the comparator 115 as the trigger signal, or may be provided to the control logic block 111, which may then generate a trigger signal applied to the comparator 115 in response to the delay signal 150.

In an additional feature of the embodiment shown in FIG. 2, delays based on DAC output magnitudes may be abandoned in lieu of simple short delays for less significant bits in the digital signal. At some point after a set number of bits have been determined, the control logic block 111 may, through a multiplexor 145 begin to "ignore" the output of the delay circuit 135 and just trigger the comparator 115 at minimum delay intervals as controlled by the control logic block 111. This will lead to improvements in the conversion time of the asynchronous SAR ADC 105.

For example, the control logic block 111 may enter a "burst" mode after the asynchronous SAR ADC 105 has determined the five MSBs of the 8-bit digital value. Prior to the burst mode, the output of the delay circuit comparator 140 may be input to a first input of a multiplexor 145 such that the first input is defaulted to pass through to become the delay signal 150 that triggers the SAR ADC comparator 115. When entering burst mode, the control logic block may then assert a selector signal 144 that selects a second input of the multiplexor 145 such that a trigger signal 143 generated by the control logic block is passed to trigger the SAR ADC comparator 115. With the combination of the inversely proportional delay times between comparisons and an enabled burst mode, the asynchronous SAR ADC 105 has improved speed and eliminates stalls so that the SAR ADC 105 can be used with sample clocks having periods that are shorter than the worst-case cumulative cycle delay of an asynchronous SAR ADC that uses constant delays. The above concepts can be applied to a single-ended asynchronous SAR ADC as well. The concepts and examples illustrated and discussed above may be better understood in conjunction with a series of timing diagrams as shown in FIG. 3.

Figure 3:
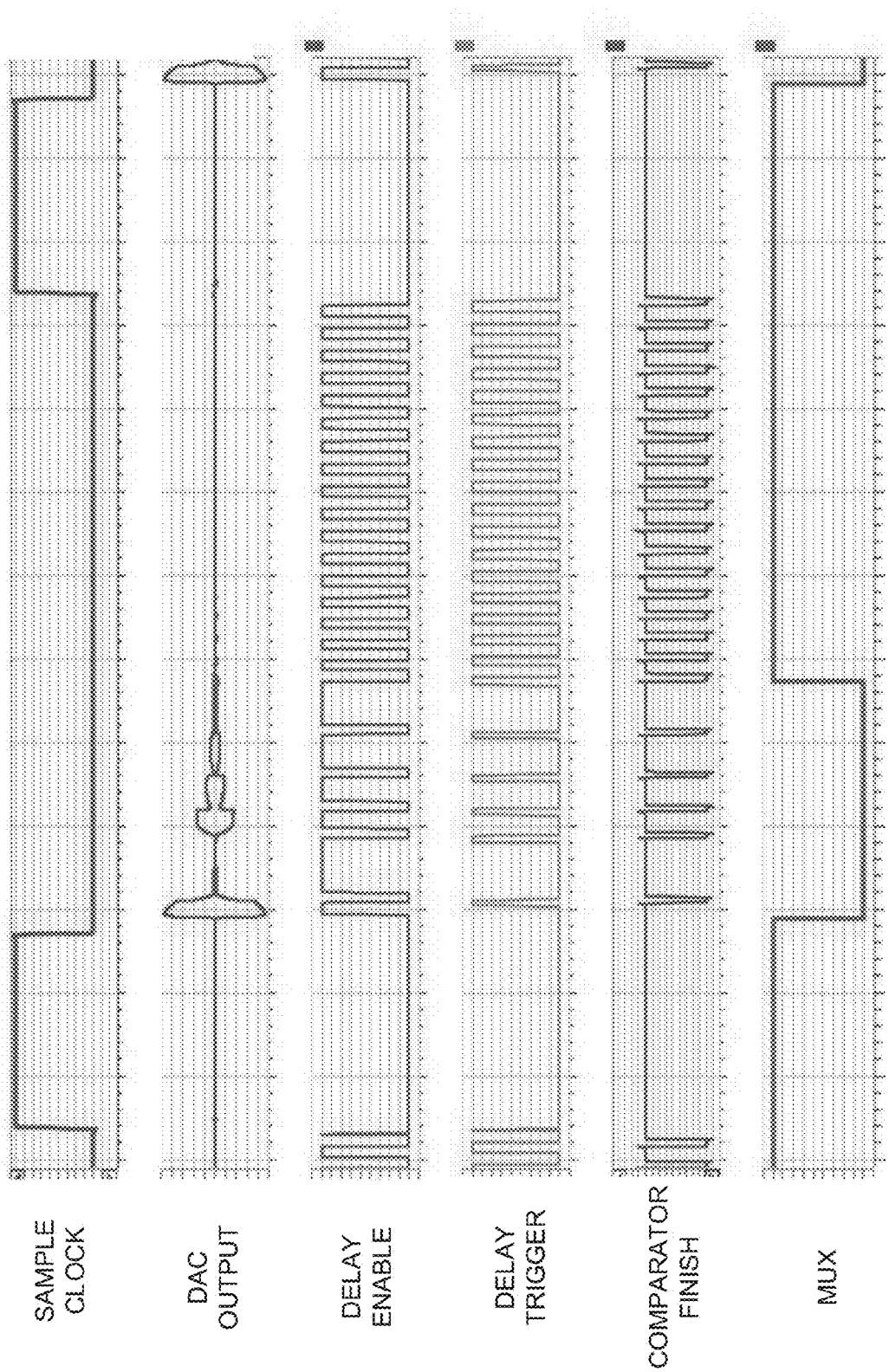
FIG. 3 is a series of timing diagrams showing various signals over time for the asynchronous SAR ADC of FIG. 2 according to an embodiment.

FIG. 3 is a series of timing diagrams showing various signals over time for the asynchronous SAR ADC 105 of FIG. 2 according to an embodiment. The timing diagrams represented in FIG. 3 show an example embodiment of various signals within the SAR ADC 105 of FIG. 2 in operation where 23 bits are generated to represent the analog signal every sample clock period. Other embodiments may exhibit different signals, but the concepts discussed herein remain similar.

The first timing diagram is a sample clock signal where one can see that the sample clock signal shows a pulse at intervals defined by the sample clock period. As discussed above, the SAR ADC 105 of FIG. 2 should resolve to a meaningful conversion before the next sample clock pulse. Thus, as can be seen in the remaining timing diagrams of FIG. 3, the activity occurs between sample clock pulses.

The second timing diagram represents the DAC output Vout. As discussed above, the DAC output signal comprises two signals, OUT and $OUT_M$. The signal $OUT_P$ shows magnitudes from the sample and hold circuit 110 within the DAC 120 to the positive side of a reference and $OUT_M$ shows magnitudes to the negative side of the reference that mirrors the signal $OUT_P$. As previously discussed, the magnitude of the DAC output signal will affect the time delay created by the delay circuit for triggering the comparator in an inversely proportional manner. Thus, when the magnitude of the DAC 120 output signal is large, one can see that the delay enable signal exhibits a short pulse coinciding with the large DAC output signal.

In turn, on the falling edge of the delay enable signal (indicating that the output of the comparator 140 has generated a logic 1 signal in a time that is proportional the DAC 120 output magnitude, e.g., quite fast in this first pass), the delay trigger signal is generated and triggers the comparator 115. Likewise, a comparator finish signal is then generated in response to the comparator 115 being triggered such that the SAR 130 can be updated according to the output of the comparator 115.

As these signals are propagating through the circuit, the DAC 120 output continues to generate another output signal indicative of the difference between its input signal and a new reference signal (which depends on how the SAR was updated from the previous comparison). As can be seen in the example of FIG. 3, just after the initial magnitude jump on the DAC 120 output signal, it returns to a low value. As there is a low value, one can see that a longer delay is generated. That is, the delay generated by the delay circuit is inversely proportional to the magnitude of the DAC 120 output. Thus, the delay enable signal exhibits a long pulse because the DAC 120 output signal is rather small. After this longer delay, once again, the delay trigger is generated after the delay enable signal falls again and the comparator then initiates a comparison after a longer delay time. This longer delay time allows the comparator 115 enough time to make a proper comparison when the DAC 120 output signal is lower. Again, the decision from the comparator 115 is then sent to the control logic block 111 for updating the SAR 130.

This iterative process continues whereby the triggering of the comparator 115 is a function of the asynchronous delay circuit 135 and the subsequent step of resetting the delay circuit 135 to sense the next bit in the successive approximation process in a function of the comparator updating the SAR 130 via the control logic block 111. After a set number of bits have been determined (six bits in a 23-bit example), the control logic block 111 may enter a burst mode by setting the multiplexor 145 signal to pass a trigger signal generated by the control logic block 111 instead of the delay circuit 135. This multiplexor 145 signal is the final timing diagram in FIG. 3. Once the burst mode has been entered, the control logic block 111 triggers the comparator 115 with steady pulses having steady intervals between comparisons, regardless of the magnitude of the DAC 120 output. This is because for a particular application, the accuracy of the asynchronous SAR DAC 105 can be relaxed after the six MSBs of the rest of the bits have been determined.

Other advantages of the asynchronous SAR ADC 105 of FIG. 2 are evident. For example, because the bit-determining comparator 115 output is not used to trigger cycles, comparator 140 can be made to have higher thermal noise to eliminate the possibility of any metastability of comparator 140 and bit-determining comparator 115 is reset after a threshold interval to eliminate any operation termination because of metastability. Furthermore, relaxing the DAC 120 settling time when the DAC 120 output is large or after entering burst mode conserves power and increases speed. Further yet, because of relaxing the DAC settling time, the accuracy of the Vref generator may be relaxed as well which also saves power and increases speed.

Figure 4:
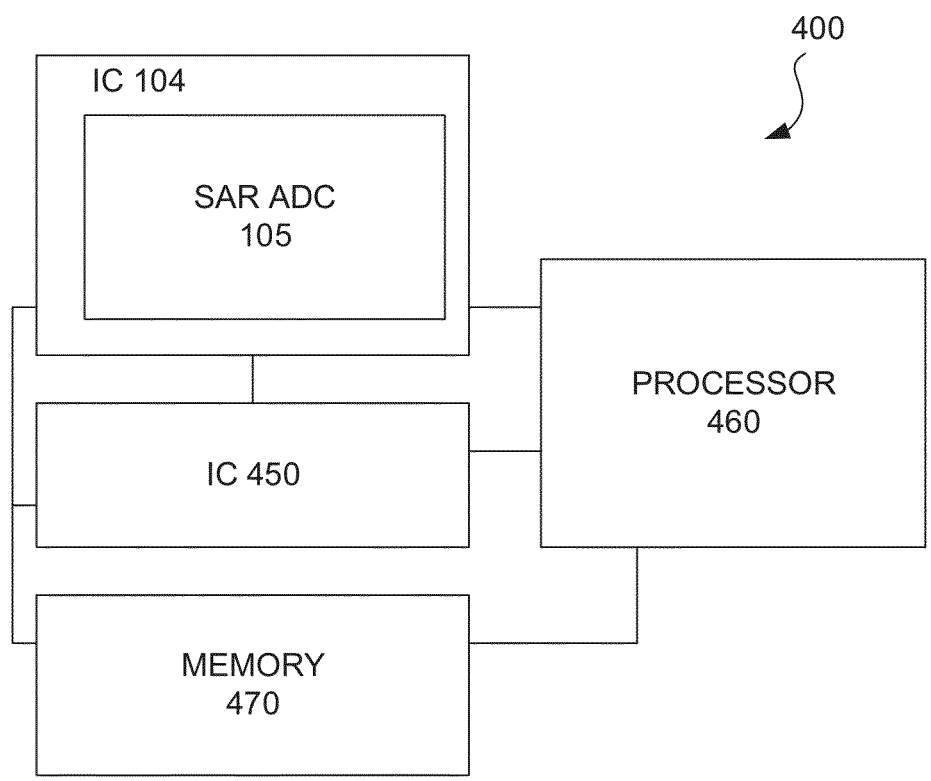
FIG. 4 is a block diagram of a system suitable for using the asynchronous SAR ADC of FIGS. 2-3 according to an embodiment.

FIG. 4 is a block diagram of a system 400 suitable for using the asynchronous SAR ADC of FIGS. 2-3 according to an embodiment. The system may include a first integrated circuit 104 having an asynchronous SAR ADC 105 as discussed above. The system 400 may further include a second integrated circuit 450 coupled to the first integrated circuit 104. These integrated circuits may be formed on respective integrated circuit dies or may be formed on a single integrated circuit die. Further yet, the integrated circuits 104 and 450 may also be communicatively coupled to a processor 460 and a memory 470, individually or collectively. Each of the additional components may be formed from the same integrated circuit dies as well or may comprise separate integrated circuit dies.

Such a system as shown in FIG. 4 may be any suitable application that may take advantage of an asynchronous SAR ADC. One particular example may be low-power sensors that have limited power available and/or limited die space for an integrated circuit. Thus, the first or second IC 104 and 450 may comprise a sensor or sensing circuit configured to sense a specific parameter, such as ambient temperature or moisture content such that an analog signal is generated to represent the sensed parameter. The analog sense signal may then be converted to a digital signal by the asynchronous SAR ADC 105.

While the subject matter discussed herein is susceptible to various modifications and alternative constructions, certain illustrated embodiments thereof are shown in the drawings and have been described above in detail. It should be understood, however, that there is no intention to limit the claims to the specific forms disclosed, but on the contrary, the intention is to cover all modifications, alternative constructions, and equivalents falling within the spirit and scope of the claims.

The invention claimed is:

1. An analog to digital converter, comprising:
   a differencing circuit configured to receive as input a sampled differential input voltage and a fraction of a reference voltage and to generate a differential output voltage representing a difference between the sampled differential input voltage and the fraction of the reference voltage;
   a delay circuit configured to generate a delay signal having a delay value that is a function of said differential output voltage;
   a comparison circuit configured to receive as input the differential output voltage and to generate an output signal as a function of a sign of the differential output voltage when triggered by a trigger signal derived from the delay signal; and
   control logic configured to receive the output signal and generate said fraction of the reference voltage as a function of the output signal.

2. The analog to digital converter of claim 1, wherein the delay value is inversely proportional to a magnitude of the differential output voltage.

3. The analog to digital converter of claim 1, wherein the trigger signal is the delay signal.

4. The analog to digital converter of claim 1, wherein the control logic is further configured to generate the trigger signal as a function of the delay signal.

5. The analog to digital converter of claim 1, wherein the trigger signal is derived from the delay signal for a first number of trigger events and wherein the control logic is further configured to generate the trigger signal with a fixed delay value for a second number of trigger events after said first number of trigger events have occurred.

6. The analog to digital converter of claim 5, wherein each output signal of the comparator sets a bit of a digital output signal that is a digital conversion of the differential input voltage, and wherein each trigger event results in generation of one bit of the digital output signal.

7. The analog to digital converter of claim 6, wherein the first number of trigger events is greater than or equal to one-half of a total; number of bits in the digital output signal.

8. The analog to digital converter of claim 1, wherein the delay circuit comprises an amplifier having a gain function configuring the amplifier to generate a logic signal having a transition time proportional to a magnitude of the differential output voltage.

9. The analog to digital converter of claim 8, wherein the gain function is selected from the group consisting of a linear gain function and an exponential gain function.

10. The analog to digital converter of claim 1, wherein each output signal of the comparator sets a bit of a digital output signal that is a digital conversion of the differential input voltage and sets a new fraction of the reference voltage.

11. A method, comprising:
    generating a differential output voltage representing a difference between a sampled differential input voltage and a fraction of a reference voltage;
    generating a delay signal having a delay value that is a function of said differential output voltage;
    in response to the delay signal, generating an output signal as a function of a sign of the differential output voltage; and
    generating the fraction of the reference voltage as a function of the output signal.

12. The method of claim 11, wherein the delay value is inversely proportional to a magnitude of the differential output voltage.

13. The method of claim 11, wherein the trigger signal is the delay signal.

14. The method of claim 11, wherein the trigger signal is generated as a function of the delay signal.

15. The method of claim 11, further comprising setting a bit of a digital output signal that is a digital conversion of the differential input voltage in response to a logic value of the output signal.

16. The method of claim 11, wherein generating the output signal is triggered from the delay signal for a first number of trigger events and wherein the output signal is triggered by a control signal having a fixed delay value for a second number of trigger events after said first number of trigger events have occurred.

17. The method of claim 16, wherein a logic value of each output signal sets a bit of a digital output signal that is a digital conversion of the differential input voltage, and wherein each trigger event results in generation of one bit of the digital output signal.

18. An analog to digital converter, comprising:
    a register configured to hold a digital value;
    a digital to analog converter configured to convert the digital value to a fractional analog reference;
    a differencing circuit configured to determine a difference between an analog input signal and the fractional analog reference;
    a comparator triggered by a trigger signal to determine a sign of said difference;
    a delay circuit configured to generate the trigger signal with a delay value determined by said difference; and
    a control circuit configured to replace a bit of said register in response to the sign output by the comparator in response to the trigger signal.

19. The converter of claim 18, wherein said delay circuit further comprises a multiplexing circuit configured to generate the trigger signal with a fixed delay value not determined by said difference.

20. The converter of claim 19, wherein the control circuit generates the fixed delay value trigger signal.

21. The converter of claim 19, wherein the trigger signal with the delay value determined by said difference is used for a first number of trigger events to trigger said comparator and wherein trigger signal with the fixed delay value is used for a second number of trigger events to trigger said comparator after said first number of trigger events.

22. The converter of claim 18, wherein the delay value is inversely proportional to a magnitude of said difference.

* * * * *